United States Patent [19]
Liou

[11] Patent Number: 6,156,634
[45] Date of Patent: Dec. 5, 2000

[54] METHOD OF FABRICATING LOCAL INTERCONNECT

[75] Inventor: Fu-Tai Liou, Hsinchu, Taiwan

[73] Assignee: United Microelectronics Corp., Hsinchu, Taiwan

[21] Appl. No.: 09/173,508

[22] Filed: Oct. 15, 1998

[30] Foreign Application Priority Data

Jul. 6, 1998 [TW] Taiwan ................................. 87110878

[51] Int. Cl.$^7$ .................................................. H01L 21/44
[52] U.S. Cl. ........................... 438/608; 438/658; 438/722
[58] Field of Search ..................................... 438/658, 659, 438/722, 608

[56] References Cited

U.S. PATENT DOCUMENTS

| | | |
|---|---|---|
| 4,039,698 | 8/1977 | Fraser et al. . |
| 4,931,411 | 6/1990 | Tigelaar et al. . |
| 5,122,225 | 6/1992 | Douglas ................................. 156/643 |

FOREIGN PATENT DOCUMENTS 01196819  8/1989  Japan .

OTHER PUBLICATIONS

Classification Definitions of the United States Patent and Trademark Office. Dec. 1996 Edition, Rev. 3, Jun. 1998. p. 257–33.
Windows Document: FR2398385. No translation.
H. Korki Ardakani; Electrical and optical properties of in situ "hydrogen–reduced" titanium dioxide thin films deposited by pulsed excimer laser ablation; Thin Solid Films, Aug. 1994.
A. A. Bos, N. S. Parekh, A. G. M. Jonkers; Formation of TiSi2 From Titanium and Amorphous Silicon Layers for Local Interconnect Technology; Thin Solid Films, Mar. 1991.

*Primary Examiner*—Donald L. Monin, Jr.
*Assistant Examiner*—Ginette Peralta
*Attorney, Agent, or Firm*—Hickman Coleman & Hughes, LLP

[57] ABSTRACT

A method of fabricating a local interconnect uses hydrogen plasma or hydrogen thermal treatment to form a local interconnect by transforming a part of the refractory metal oxide to a conductor. The local interconnect can be used to electrically connect two electrodes in a device, or to electrically connect same electrodes of different devices.

27 Claims, 5 Drawing Sheets

METHOD OF FABRICATING LOCAL INTERCONNECT

CROSS-REFERENCE TO RELATED APPLICATION

This application claims the priority benefit of Taiwan application serial no. 87110878. filed Jul. 6, 1998. the full disclosure of which is incorporated herein by reference.

BACKGROUND OF THE INVENTION

1. Field of the Invention

The invention relates in general to a method of fabricating a local interconnect in an integrated circuit (IC), and more particularly, to a method of fabricating a local interconnect by transforming refractory metal oxide into a semiconductor or a conductor.

2. Description of the Related Art

As integrated circuits are developed towards a direction of higher and higher integration, the number of interconnects required for electrical connection between devices or electrodes is increased. However, the surface area of a chip available for forming interconnects becomes more and more limited due to the shrinking dimensions of devices. Therefore, two or more conductive layers are designed to meet the requirements of high integration and limited surface area. For example, while fabricating a complex device such as a microprocessor, at least four or five metal layers are required to achieve the electrical connection between electrodes or devices of the microprocessor.

In the design of a sub-micron integrated circuit, a local interconnect is formed to improve packing density. In circuit layout design, a local interconnect is used for horizontal connection between closely spaced devices.

Various types of local interconnects have been developed and applied in integrated circuit design. The material used for fabricating a local interconnect includes refractory metal silicide on poly-silicon, single or double doped poly-silicon, multi-layered refractory metal which is partially converted into silicide, or refractory metal formed by physical vapor deposition (PVD) or chemical vapor deposition (CVD).

FIGS. 1A–1D show a conventional process for fabricating a local interconnect. In FIG. 1A, a semiconductor substrate 10 having a shallow trench isolation 11 formed therein is provided. A gate oxide layer 12 is formed on the substrate 10, and a first gate electrode 13 and a second gate electrode 14 are formed on the gate oxide layer 12. A spacer 15 is formed on each sidewall of the first gate electrode 13 and the second gate electrode 14. An extension surface of the electrodes 13 and 14 are left exposed. The material of the first gate electrode 13 and the second gate electrode 14 includes doped poly-silicon, whereas the material of the spacer 15 includes silicon oxide.

In FIG. 1B, a self-aligned silicide (salicide) layer 16 is formed on the exposed surface of the first gate electrode 13, the exposed surface of the second gate electrode 14, and the exposed substrate 10. In a conventional process of forming salicide, a metal layer, for example, a titanium layer with a thickness of about 200–1000 Å, is formed over the surface of the substrate 10 by DC magnetron sputtering. Under a high temperature, the metal layer reacts with the poly-silicon of the first and second gate electrodes 13, 14 and the silicon of the exposed substrate 10 and is transformed into a metal silicide layer 16, for example, titanium silicide ($TiSi_2$). The remaining metal layer, which does not form a suicide, is then removed.

In FIG. 1C, a titanium nitride layer 17a is formed over the surface of the substrate 10 by reactive sputtering. A photo-resist layer 18 is formed and patterned to cover the second gate electrode 14, and about a half of the region between the first and the second gate electrodes 13, 14.

In FIG. 1D, the titanium nitride 17a (shown in FIG. 1C) is removed by etching, using the photo-resist layer 18 as a mask. The subsequent processes, for example, removing the photo-resist layer 18, are then performed to complete the formation of the local interconnect. The resultant pattern of the titanium nitride layer is denoted as 17b as shown in the figure.

Processes such as deposition of titanium nitride, patterning and etching are required for the above method, the result of which is poor controllability. There is thus a need for a process of forming a local interconnect that is simpler and more controllable. In addition, an uneven topography of the device results from the prior processes, and that is disadvantageous to the subsequent process. There is thus a need for a process resulting in a more even topography.

SUMMARY OF THE INVENTION

It is an object of the invention to provide a method of fabricating a local interconnect. A smooth topography on the resulting device is obtained by this method.

Another object of the invention is to provide a method of fabricating a local interconnect with a simplified fabricating process. These and other objects are achieved by forming a refractory metal oxide layer and selectively transforming the refractory metal oxide layer into a semiconductor or a conductor using a hydrogen plasma treatment in order to form a local interconnect from the transformed refractory metal oxide layer. In addition to the smooth topography of the device, a better controllability of fabrication is obtained.

A refractive metal oxide layer is formed on a provided substrate. A hydrogen treatment is performed on a certain part of the refractive metal oxide layer. This part of the refractive metal oxide layer is thus transformed into a semiconductor or a conductor and determined as the local interconnect. The rest of the refractory metal oxide layer is then removed.

Both the foregoing general description and the following detailed description are exemplary and explanatory only and are not restrictive of the invention.

DETAILED DESCRIPTION

Figure 1A:
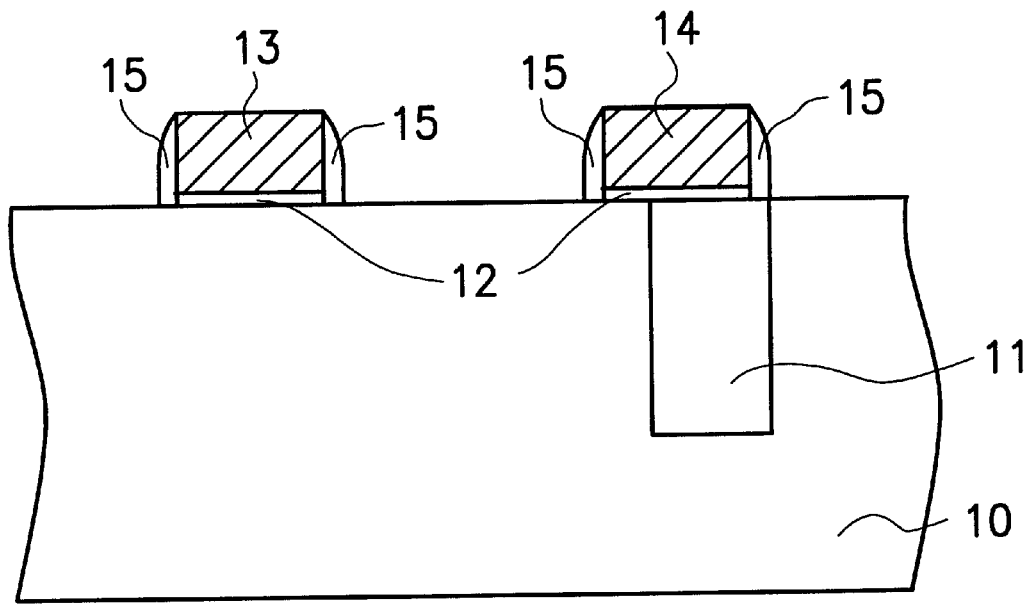
FIG. 1A to FIG. 1D are cross-sectional views, of which a conventional method of fabricating a local interconnect is shown.
Figure 1B:
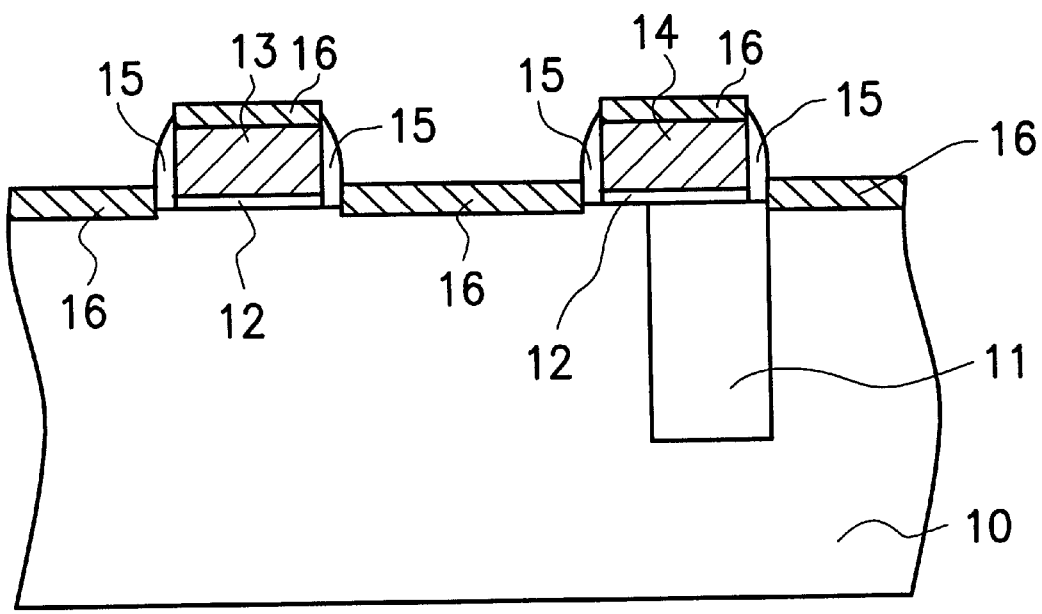
Figure 1C:
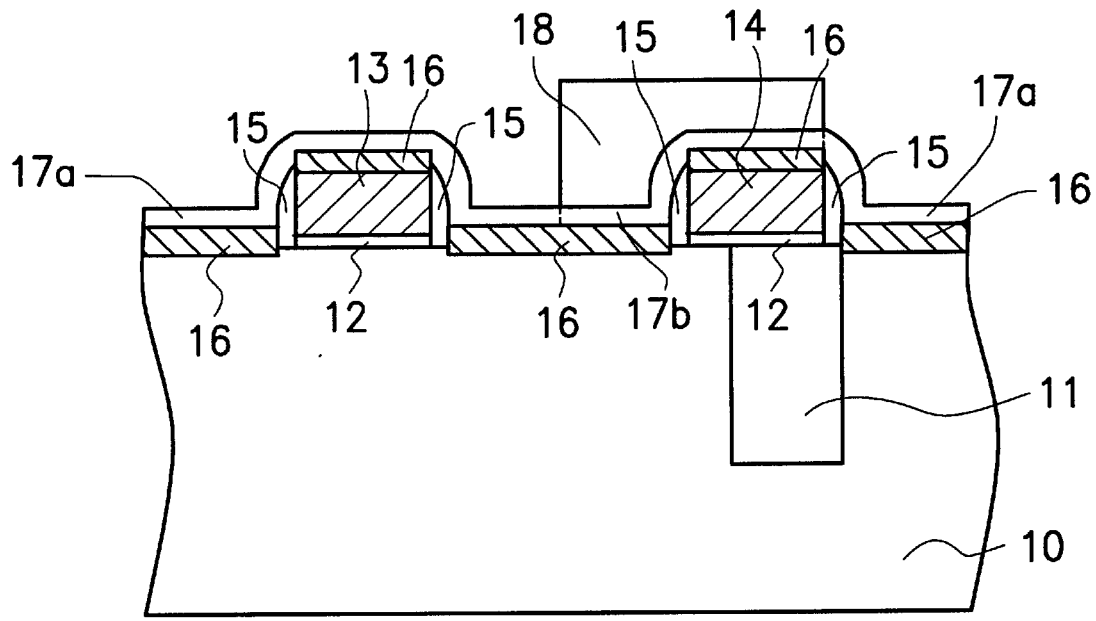
Figure 1D:
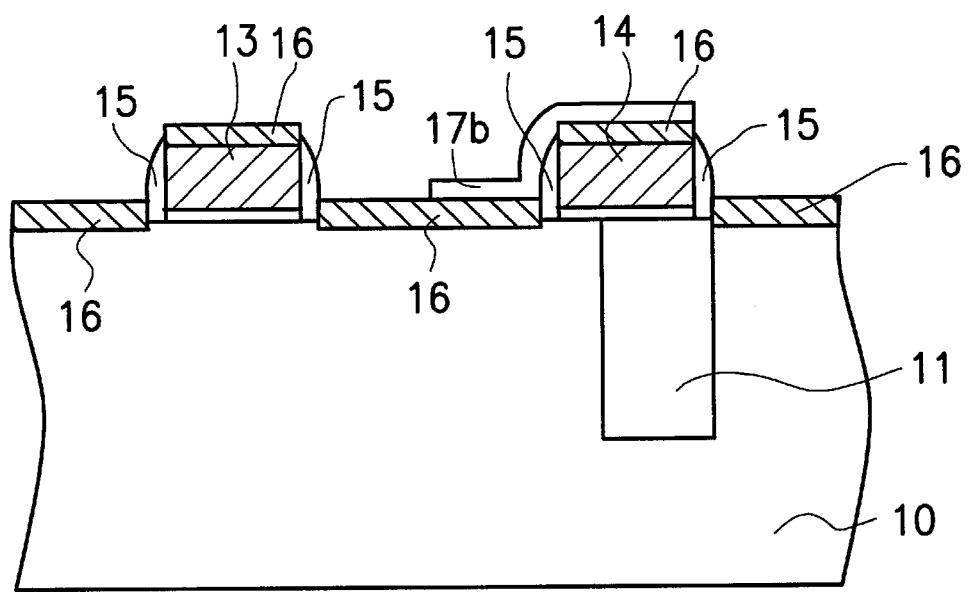

Refractory metal oxide, such as titanium oxide ($TiO_2$), tantalum oxide ($Ta_2O_5$), iron oxide ($Fe_2O_3$) and barium-titanium oxide ($BaTiO_3$), is a kind of insulator having a very wide band gap. By a hydrogen treatment, hydrogen is introduced into interstices in the atomic structure or vacancies of oxygen in the refractory metal oxide, so that the interstices and the vacancies are not occupied by oxygen in the subsequent process. Hydrogen plasma treatment or hydrogen thermal treatment is believed suitable for this hydrogen treatment, although other procedures may also work. In simpler terms, the vacancies of oxygen are various locations at which oxygen can be located in the is refractory metal oxide. The hydrogen treatment causes some of these locations where oxygen can be located from being occupied by oxygen. It is believed that in the refractive metal oxide, the oxygen content is a key factor which determines the conductivity. With less oxygen content, the refractory is believed to have characteristics close to a metal. On the contrary, with more oxygen content, the refractory metal oxide is believed to have conductive characteristic close to an insulator. That is, the refractory metal oxide with less oxygen content has a higher conductivity, whereas the refractory metal oxide with more oxygen content has a lower conductivity. Furthermore, some oxygen atoms in the refractory metal oxide are believed to even be expelled and replaced by the hydrogen atoms. The reacting mechanism of expelling oxygen is represented as:

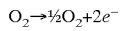

$$O_2 \rightarrow \tfrac{1}{2}O_2 + 2e^-$$

As shown from the above mechanism, when an oxygen molecule is expelled or replaced, two moles of electrons are produced. These electrons are mobile charged carriers which increase the conductivity of the refractory metal oxide layer. With these mobile electrons, the refractive metal oxide is transformed from an insulator to an n-type semiconductor. If a sufficient amount of oxygen in the refractory metal oxide is expelled or replaced by hydrogen, a large amount of electrons are produced. The refractory metal oxide can even be transformed from an insulator into a conductor.

The conductivity of the refractory metal oxide depends on how much oxygen is expelled or replaced. Moreover, the conductivity of the refractory metal oxide varies with the amount of electrons produced by expelling oxygen. Using hydrogen plasma treatment or hydrogen thermal treatment, the oxygen content in the refractory metal oxide can be controlled or adjusted. Consequently, the conductivity, or the resistance, of the refractory metal oxide can be adjusted to a predetermined level. The more the hydrogen treatment decreases the oxygen content, the greater the conductivity and the lower the resistance are.

The method of introducing, hydrogen into the refractory metal oxide to adjust the conductivity is described in more detail in "Semiconductor Electrodes for Photo-electrolysis, p. 151, State University of New York, 1982" by Fu-Tai Lious "Solid Electro-chemical Modification of Semiconductors. Solid State Comm., Vol. 43, No. 8, pp. 633–636 by C. Y. Yang et. al.", and "Photo-electrolysis at $Fe_2O_3/TiO_2$ Heterojunction Electrode. Journal of the Electrochemical Society, Vol. 129, No. 2, pp. 342–345, 1982" by Fu-Tai Liou, each of which is incorporated herein in full by reference.

Figure 2A:
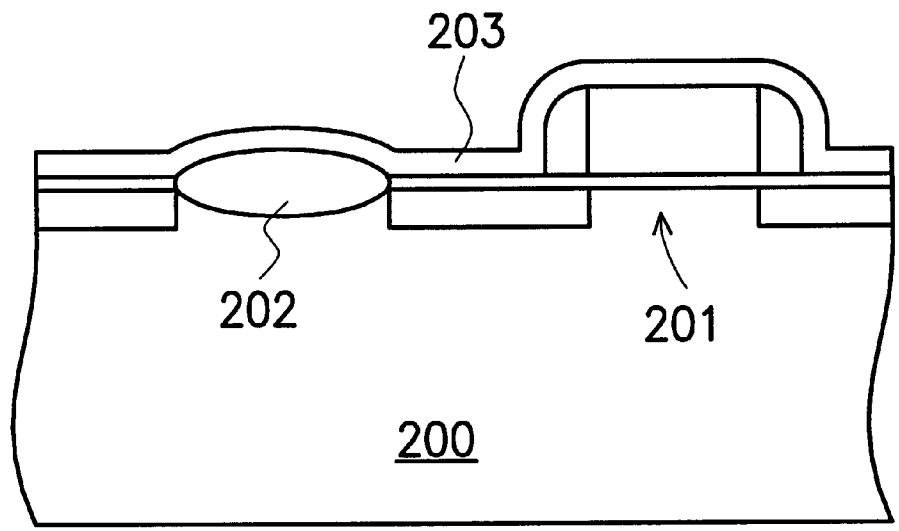
FIG. 2A and FIG. 2B are cross-sectional views, of which a method of fabricating a local interconnect in a first preferred embodiment according to the invention is shown.
Figure 2B:
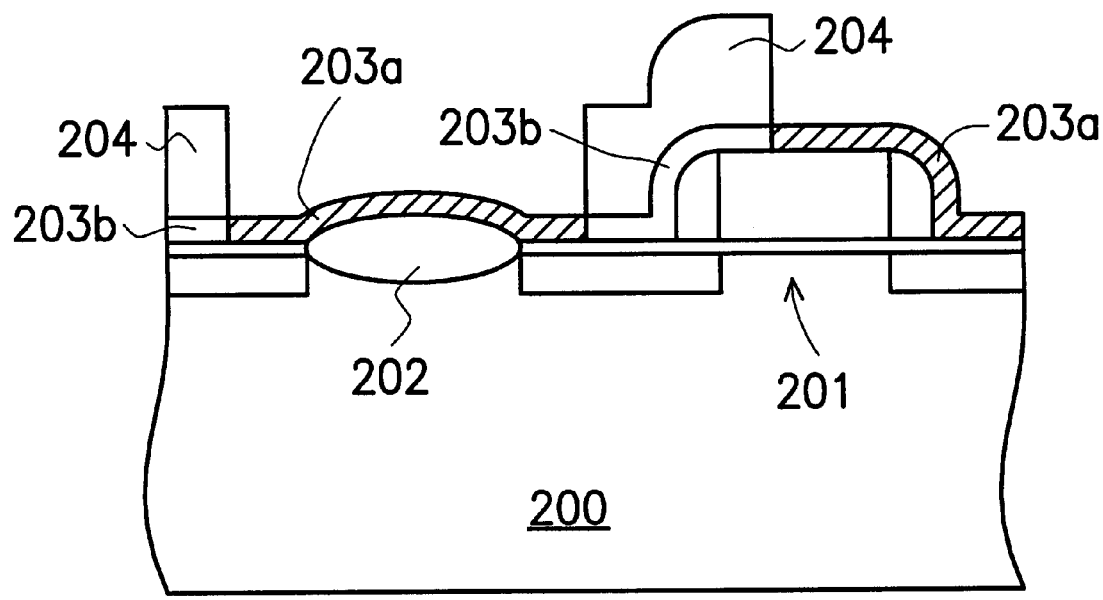

FIG. 2A and FIG. 2B show a method of fabricating a local interconnect in a first embodiment according to the invention.

In FIG. 2A. a semiconductor substrate 200 with a semiconductor device 201 and an insulation structure 202 is provided. In this embodiment, a substrate 200 with a MOS device 201 and a field oxide layer 202 is provided as an example; devices other than the MOS device 201 also can be used. When the substrate comprises more than one device, these devices are isolated by isolation structures. A refractory metal oxide layer 203, for example, a $TiO_2$ layer, a $Ta_2O_5$ layer, a $Fe_2O_3$ layer, a $BaTiO_3$ layer, or any combination of these layers is formed over a surface of the substrate 200 and any formations thereon.

In FIG. 2B, a mask layer 204 is formed to cover a part of the refractory metal oxide layer 203. The part of the refractory metal oxide layer 203 covered by the mask layer 204 is denoted as 203b in this figure, whereas the exposed part of the refractory metal oxide layer is denoted as 203a. Using the mask layer 204 as a mask, or as a diffusion barrier layer, a hydrogen plasma treatment or a hydrogen thermal treatment is performed to improve the conductivity of the refractory metal oxide layer 203a. The exposed refractory metal oxide 203a is transformed from an insulator into a semiconductor, or even a conductor.

Figure 3A:
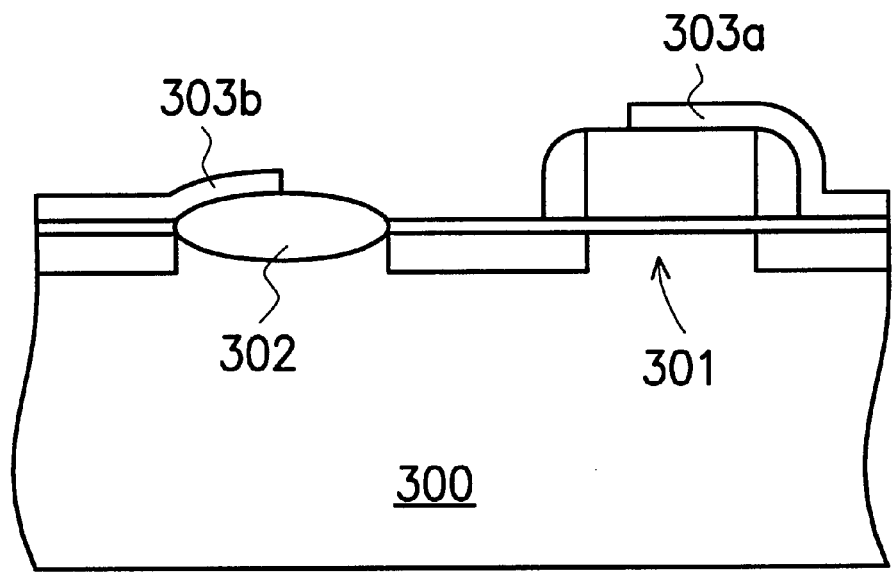
FIG. 3A and FIG. 3B are cross-sectional views, of which a method of fabricating a local interconnect in a second preferred embodiment according to the invention is shown.
Figure 3B:
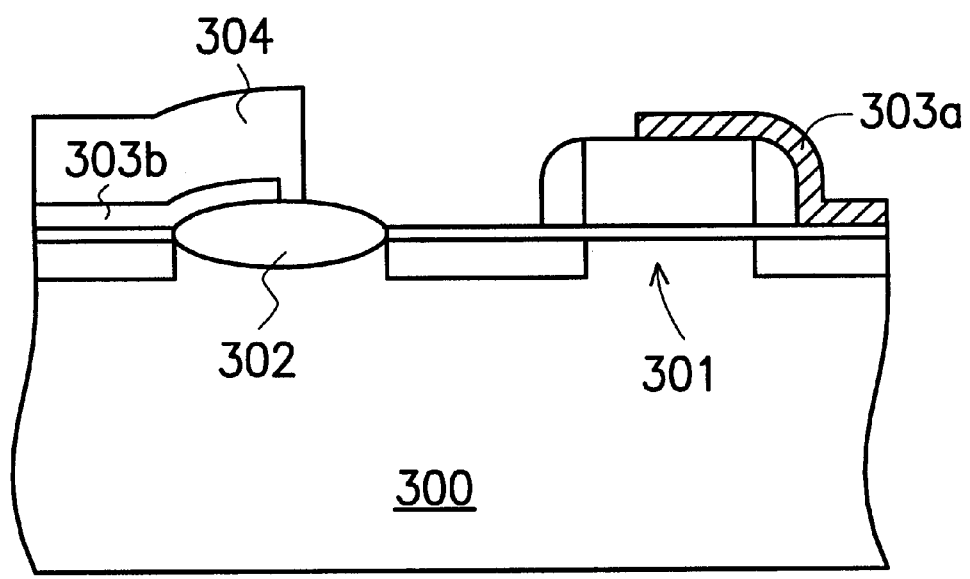

FIG. 3A and FIG. 3B show a method of fabricating a local interconnect in a second embodiment according to the invention.

FIG. 3A, a semiconductor substrate 300 with a semiconductor device 301 and an insulation structure 302 is provided. In this embodiment, a substrate 300 with a MOS 301 device and a field oxide layer 302 is provided as an example. A refractory metal oxide layer comprising a pattern of two parts denoted as 303a and 303b is formed over the substrate 300. The refractory metal oxide layers 303a and 303b are formed of material such as a $TiO_2$ layer, a $Ta_2O_5$ layer, a $Fe_2O_3$ layer, a $BaTiO_3$ layer, or any combination of these layers by photolithography and etching.

In FIG. 3B, a mask layer 304 is formed to cover a part of the refractory metal oxide layer 303a and 303b. For illustration, the refractory metal oxide layer 303b is covered. Using the mask layer 304 as a mask, or as a diffusion barrier layer, a hydrogen plasma treatment or a hydrogen thermal treatment is performed to transform the exposed part of the refractory metal layer 303a into a semiconductor or a conductor. With the protection of the mask layer 304, the refractory metal layer 303b is maintained as an insulator as it was before the treatment.

Figure 4A:
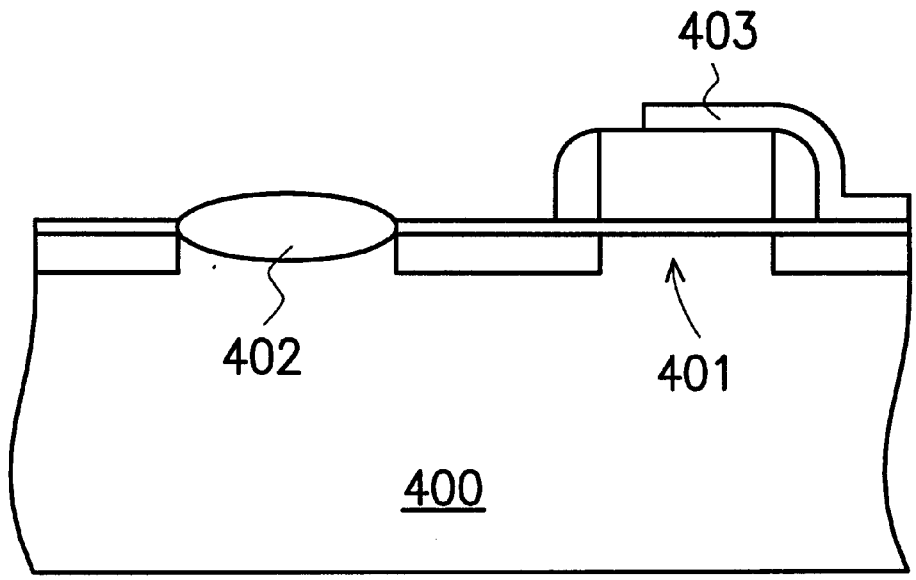
FIG. 4A and FIG. 4B are cross-sectional views, of which a method of fabricating a local interconnect in a second preferred embodiment according to the invention is shown.

In FIG. 4A, a semiconductor substrate 400 with a semiconductor device 401 and an insulation structure 402 is provided. In this embodiment, a substrate 400 with a MOS 401 and a field oxide layer 402 is provided as an example. A refractory metal oxide layer 403 is formed over the substrate 400. The refractory metal oxide layer 403 is formed of material such as a $TiO_2$ layer, a $Ta_2O_5$ layer, a $Fe_2O_3$ layer, a $BaTiO_3$ layer, or any combination of these layers by photolithography and etching.

Figure 4B:
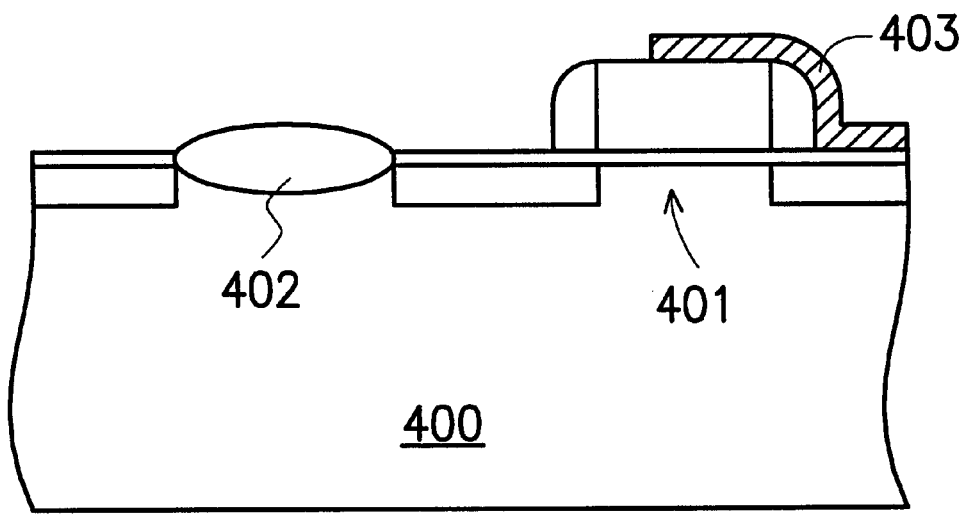

In FIG. 4B, using hydrogen plasma or hydrogen thermal treatment, the refractory metal oxide layer 403 is transformed into a semiconductor or a conductor.

In the three embodiments mentioned above, the local interconnect is formed by transforming at least a part of the refractive metal oxide layer into a semiconductor or a conductor. Being a semiconductor or a conductor, without forming an additional conductive layer, the local interconnects can be used to electrically connect any two electrodes such as gate and drain electrodes or gate and source electrodes, or to electrically connect the same electrodes of different devices with a good conductivity.

In the fabricating method of forming a local interconnect according to the invention, since the local interconnect is transformed into a semiconductor or a conductor, an additional conductive layer, for example, a salicide layer, is not required to obtain a good electrical connection between electrodes or device. Without the formation of the additional conductive layer, a smoother topography is obtained compared to the local interconnect formed by the prior process.

The smooth topography is advantageous to the subsequent process for accomplishing the fabrication of a device. For example, a better alignment is obtained with a smooth topography during exposure. In addition, the method is simplified compared to the conventional method, and therefore, a better controllability is obtained.

There is thus provided a method for changing the conductivity of a refractory metal oxide layer by hydrogen treatment. While various increases in conductivity can be used, the increase is preferably sufficient to transform the treated area into a semiconductor, or even a conductor, suitable for use as a local interconnect. The process results in components having a smoother topography and improved and more consistently controlled parameters.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a local interconnect on a substrate, the method comprising the steps of:

forming a refractory metal oxide layer on the substrate; and performing a hydrogen treatment after the formation of the refractory metal oxide layer to improve conductivity of at least a part of the refractory metal oxide layer.

2. The method according to claim 1, comprising the further step of forming at least a semiconductor device on the substrate before the formation of the refractory metal oxide layer.

3. The method according to claim 1, comprising the further step of forming a plurality of semiconductor devices on the substrate before the formation of the refractory metal oxide layer, wherein a plurality of isolation structures are formed to isolate the semiconductor devices.

4. The method according to claim 1, wherein the refractory metal oxide layer includes at least one of a $TiO_2$ layer, a $Ta_2O_5$ layer, and a $BaTiO_3$ layer.

5. The method according to claim 1, wherein the hydrogen treatment includes a hydrogen plasma treatment.

6. The method according to claim 1, wherein the hydrogen treatment includes a hydrogen thermal treatment.

7. The method according to claim 1, comprising the step of forming and patterning a mask layer to expose the part of the refractory metal oxide layer before performing the hydrogen treatment.

8. The method according to claim 7, wherein the mask layer includes a diffusion barrier layer.

9. The method according to claim 1, wherein the part of the refractory metal oxide layer has a decreased oxygen content after the hydrogen treatment.

10. The method according to claim 1, wherein a plurality of electrons is produced by performing the hydrogen treatment.

11. The method according to claim 1, comprising the step of using the part of the refractory metal oxide layer with the increased conductivity as the local interconnect.

12. The method according to claim 11, wherein the local interconnect has a smooth topography.

13. A method of forming a local interconnect on a substrate, the method comprising the steps of:

forming a refractory metal oxide layer on the substrate; and transforming at least part of the refractory metal oxide layer into a conductive layer after the formation of the refractory metal oxide layer.

14. The method according to claim 13, wherein the conductive layer includes a semiconductor.

15. The method according to claim 13, wherein the conductive layer includes a conductor.

16. The method according to claim 13, wherein the step of transforming the refractory metal oxide layer comprises a hydrogen treatment.

17. The method according to claim 16, wherein the hydrogen treatment includes a hydrogen plasma treatment.

18. The method according to claim 16, wherein the hydrogen treatment includes a hydrogen thermal treatment.

19. A method of fabricating a local interconnect on a substrate, the method comprising the steps of:

forming a refractory metal oxide layer on the substrate;

removing a part of the refractory metal layer; and performing hydrogen treatment on the remaining refractory metal oxide layer to transform the remaining refractory metal oxide layer into a semiconductor or conductor.

20. The method according to claim 19, wherein the refractory metal oxide layer comprises at least one of a $TiO_2$ layer, a $Ta_2O_5$ layer and a $BaTiO_3$ layer.

21. The method according to claim 19, wherein the hydrogen treatment includes a hydrogen plasma treatment.

22. The method according to claim 19, wherein the hydrogen treatment includes a hydrogen thermal treatment.

23. The method according to claim 19, wherein the refractory metal oxide layer is transformed into a semiconductor by the hydrogen treatment.

24. The method according to claim 19, wherein the refractory metal oxide layer is transformed into a conductor by the hydrogen treatment.

25. A method of fabricating a local interconnect on a substrate comprising the steps of:

forming a $Fe2O_3$ local interconnect on a substrate; and performing a hydrogen treatment to at least a part of the $Fe2O_3$ local interconnect so as to improve the conductivity thereof.

26. The method according to claim 25, where the step of performing a hydrogen treatment further includes transforming the $Fe2O_3$ into a semiconductor or a conductor.

27. A method of fabricating a local interconnect over a substrate, the method comprising the steps of:

providing a substrate comprising a MOS transistor thereon, the MOS transistor comprising a source region, a drain region, a gate region, an isolation layer and a plurality of conductive parts;

forming a plurality of local interconnects to connect a plurality of pairs of the source region, the drain region, the gate region and the plurality of conductive parts; and performing a hydrogen treatment on at least one of the local interconnects.

* * * * *